US009294122B2

(12) United States Patent  
Greene et al.

(10) Patent No.: US 9,294,122 B2  
(45) Date of Patent: *Mar. 22, 2016

(54) FIELD LEVEL COMPRESSION IN PARALLEL DATA FLOWS

(71) Applicant: International Business Machines Corporation, Armonk, NY (US)

(72) Inventors: Lawrence A. Greene, Plainville, MA (US); Eric A. Jacobson, Arlington, MA (US); Yong Li, Newtown, MA (US); Xiaoyan Pu, Chelmsford, MA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/645,048

(22) Filed: Mar. 11, 2015

(65) Prior Publication Data

US 2015/0311915 A1 Oct. 29, 2015

Related U.S. Application Data

(63) Continuation of application No. 14/261,702, filed on Apr. 25, 2014.

(51) Int. Cl.  
H03M 7/30 (2006.01)  
H04L 29/06 (2006.01)  
H04L 29/08 (2006.01)

(52) U.S. Cl.  
CPC ............ *H03M 7/30* (2013.01); *H04L 29/0604* (2013.01); *H04L 29/08135* (2013.01)

(58) Field of Classification Search  
USPC .............................. 341/51; 709/201–203, 247  
See application file for complete search history.

(56) References Cited

U.S. PATENT DOCUMENTS

| 5,764,885 | A | 6/1998 | Sites et al. |
| 6,493,764 | B1 | 12/2002 | Aldred et al. |
| 7,552,130 | B2 | 6/2009 | Cook et al. |
| 8,279,096 | B2 | 10/2012 | Novy |

(Continued)

FOREIGN PATENT DOCUMENTS

EP 1283486 A2 2/2003

OTHER PUBLICATIONS

Anonymously; "Enhanced Data File Compression Method for Data Movement"; An IP.com Prior Art Database Technical Disclosure; http://ip.com/IPCOM/000229452D; Jul. 30, 2013.

(Continued)

*Primary Examiner* — Howard Williams  
(74) *Attorney, Agent, or Firm* — Susan Murray; Edell, Shapiro & Finnan, LLC

(57) ABSTRACT

According to one embodiment of the present invention, a system selectively compresses data fields in a parallel data flow. The system identifies within an execution plan for the parallel data flow a first instance of a data field within a stage of the parallel data flow. The system traces the identified data field through stages of the parallel data flow and determines a score value for the identified data field based on operations performed on the identified data field during traversal of the stages. The system compresses the identified data field based on the score value indicating a performance gain with respect to the compressed data field. Embodiments of the present invention further include a method and computer program product for selectively compressing data fields in a parallel data flow in substantially the same manners described above.

7 Claims, 10 Drawing Sheets

(56) References Cited

U.S. PATENT DOCUMENTS

| | | |
|---|---|---|
| 8,295,615 B2 | 10/2012 | Cell, Jr. |
| 8,515,898 B2 | 8/2013 | Bhide et al. |
| 2010/0061455 A1 | 3/2010 | Xu et al. |
| 2011/0063884 A1 | 3/2011 | Blanc |
| 2012/0154405 A1 | 6/2012 | Baumgartner et al. |
| 2013/0067198 A1 | 3/2013 | Archer et al. |
| 2014/0229482 A1* | 8/2014 | Milenova .......... G06F 17/30289 707/737 |

OTHER PUBLICATIONS

IBM; "A Method to Compress Long Duration Data by Statistical Methods"; An IP.com Prior Art Database Technical Disclosure; http://ip.com/IPCOM/000135938D; Apr. 28, 2006.

List of IBM Patents or Patent Applications Treated as Related, Mar. 27, 2015.

* cited by examiner

```
// Loop through all the stages in the execution plan looking for the
// first instances of fields appearing in the flow.
// Parameters:
// execution_plan - contains a directed acyclic graph of stages connected
//                                    by datasets
mark_field_compression(execution_plan)
{
  for each stage in execution plan
  {
    for each dataset in output datasets of current stage
    {
      for each field in output fields of current dataset
      {
        if field copied from input field
          continue; // This is not a new field, skip on to next // This is a new field, follow it through the execution plan
        compute_compression_runs(stage, dataset, field, 0);
      }
    }
  }
}
```

FIG.4A

```
// Recursively descend through the dataflow following a particular
// field through output datasets of the flow stages. When a field run
// ends compute the score of the run and if greater than zero mark the
// field on the source stage to be compressed.
// Parameters:
// source_stage - The source stage of the run where the field first appeared
// output_dataset - The dataset we will follow to the next stage
// field - The field being searched
// sum - A running sum of the weighted field size minus the weighted compressed size
compute_compression_runs(source_stage, output_dataset, field, sum)
{
  // No dataset, nothing to follow, end of the run
  if output_dataset = NULL
  {
    if should_compress(sum, field) = true
    {
      source_stage->mark_compress(field);
    }
    return;
  }

//        BLOCK 410
  // Add the output dataset weighted field size to total sum
  // Dataset weight based on transport mechanism
  // Field compressedSize is a precalculated estimate of compressed size
  sum += (output_dataset->weight() * field->size) -
              (output_dataset->weight() * field->compressedSize);

//        BLOCK 420
  // Get the down stream stage attach to this dataset
  current_stage = output_dataset->target_stage;

//        BLOCK 430
  if current_stage->accesses(field)
  { // Current stage uses this field in some way, end of the run
    if should_compress(sum, field) = true
    {
      source_stage->mark_compress(field);
    }

// Start a new run of this field, set sum back to zero
    sum = 0;
    // The current stage is now the source of a new run
    source_stage = current_stage;
  }
```

FIG.4B

```
//      BLOCK 440
// Add stage weight based on if it lands data to disk, eg. sort
// For many stages that just pass the field through this will be zero
// Field compressedSize is a precalculated estimate of compressed size
sum += (current_stage->weight() * field->size) -
            (current_stage->weight() * field->compressedSize);

bool fieldContinues = false;
//      BLOCK 450
// Loop through this Stage's output datasets
for each cur_output_dataset in current_stage
{
  if field in cur_output_dataset
  { // Follow the field down the output dataset
    compute_compression_runs(source_stage, cur_output_dataset, field, sum);
    // Set this flag so we know the field exists in at least one output
    // dataset and that we will compute the score in some downstream stage,
    // not the current one.
    fieldContinues = true;
  }
}

//      BLOCK 460
// If the field doesn't continue this means it is either dropped from the
// flow or this is a target stage where all fields end.
if fieldContinues = false
{ // The field doesn't continue on in the flow
  if should_compress(sum, field) = true
  {
    source_stage->mark_compress(field);
  }
 }
}
```

FIG.4B (CONTINUED)

```
// Given the running sum of the field hop scores, determine if the field should
// be compressed.
// Parameters:
// sum - The running sum of the weighted field size minus the weighted compressed size
// field - The field being searched
bool should_compress(sum, field)
{
  // Take the overall sum of scores and subtract the weight for compression and
  // decompression for the field size.  These weights are configurable.
  score = sum - ((WeightCompress + WeightUncompress) * field->size);

// If the score is greater than the configured score cutoff(default 0)
  // then we should compress the field
  if score > scoreToCompress
    return true;
  else
    return false;
}
```

FIG.4C

FIELD LEVEL COMPRESSION IN PARALLEL DATA FLOWS

CROSS-REFERENCE TO RELATED APPLICATIONS

This application is a continuation of U.S. patent application Ser. No. 14/261,702, entitled "FIELD LEVEL COMPRESSION IN PARALLEL DATA FLOWS" and filed Apr. 25, 2014, the disclosure of which is incorporated herein by reference in its entirety.

BACKGROUND

Present invention embodiments relate to information processing, and more specifically, to selectively compressing data fields in a parallel data flow.

Parallel data processing engines (e.g., Extract, Transform, and Load (ETU) engines; MapReduce engines; etc.) typically process large volumes of data (e.g., terabytes). The data is broken up into records, each of which is individually processed by different stages of the engine. Each record is broken into a set of fields, each with its own data type and space requirements. Depending on the processing engine used, data may be passed from one process to another, written to disk, and passed over a network within the same data flow. In order to reduce the overhead for transporting data through a parallel data flow, many processing engines (e.g., HADOOP® MapReduce) compress records or blocks of records as they are written to disk or sent over a network. However, data written many times may require a significant number of compressions and decompressions.

SUMMARY

According to one embodiment of the present invention, a system selectively compresses data fields in a parallel data flow. The system identifies within an execution plan for the parallel data flow a first instance of a data field within a stage of the parallel data flow. The system traces the identified data field through stages of the parallel data flow and determines a score value for the identified data field based on operations performed on the identified data field during traversal of the stages. The system compresses the identified data field based on the score value indicating a performance gain with respect to the compressed data field. Embodiments of the present invention further include a method and computer program product for selectively compressing data fields in a parallel data flow in substantially the same manners described above.

BRIEF DESCRIPTION OF THE SEVERAL VIEWS OF THE DRAWINGS

Generally, like reference numerals in the various figures are utilized to designate like components.

FIGS. 4A-4C depict a pseudo-code listing illustrating an example manner of recursively analyzing and updating an execution plan to apply field level compression according to an embodiment of the present invention.

DETAILED DESCRIPTION

Present invention embodiments relate to selectively compressing data fields within a data flow (e.g., the data flow of an Extract, Transform, and Load (ETL) process, database query plan, MapReduce job, etc.). Field level compression may be performed at the edges of a data flow, and may be applied mid-flow to fields accessed one or more times within the flow. According to an embodiment of the present invention, a processing engine analyzes an execution plan for a data flow, and opts to compress individual fields or groups of fields within each record if it determines that the processing time or other cost to compress and decompress the fields will be lower than the cost saved by passing them through the data flow in compressed form. The engine may avoid compressing fields that are unlikely to improve performance, such as a key field that is accessed many times within the data flow. The engine may compute a compression "score" for each field. The score represents the overhead for passing the field through operations in uncompressed rather than compressed form, and includes an adjustment for the overhead for compressing and uncompressing the field. The compression "score" may be computed for each field "run" in a job, where a field run is a set of stages the field is passed through without being accessed. A field run may be an entire job if the field is simply passed through and never accessed.

One aspect of a present invention embodiment is to improve performance by reducing the amount of data written to disk or passed through stages of a complex parallel data flow, while taking into account the data transfer medium that is being used to pass the data through the data flow (e.g., a network, memory bus, disk I/O, etc.), the overhead of passing data between processes on the same machine, and the number of times the data is to be compressed and uncompressed.

Figure 1:
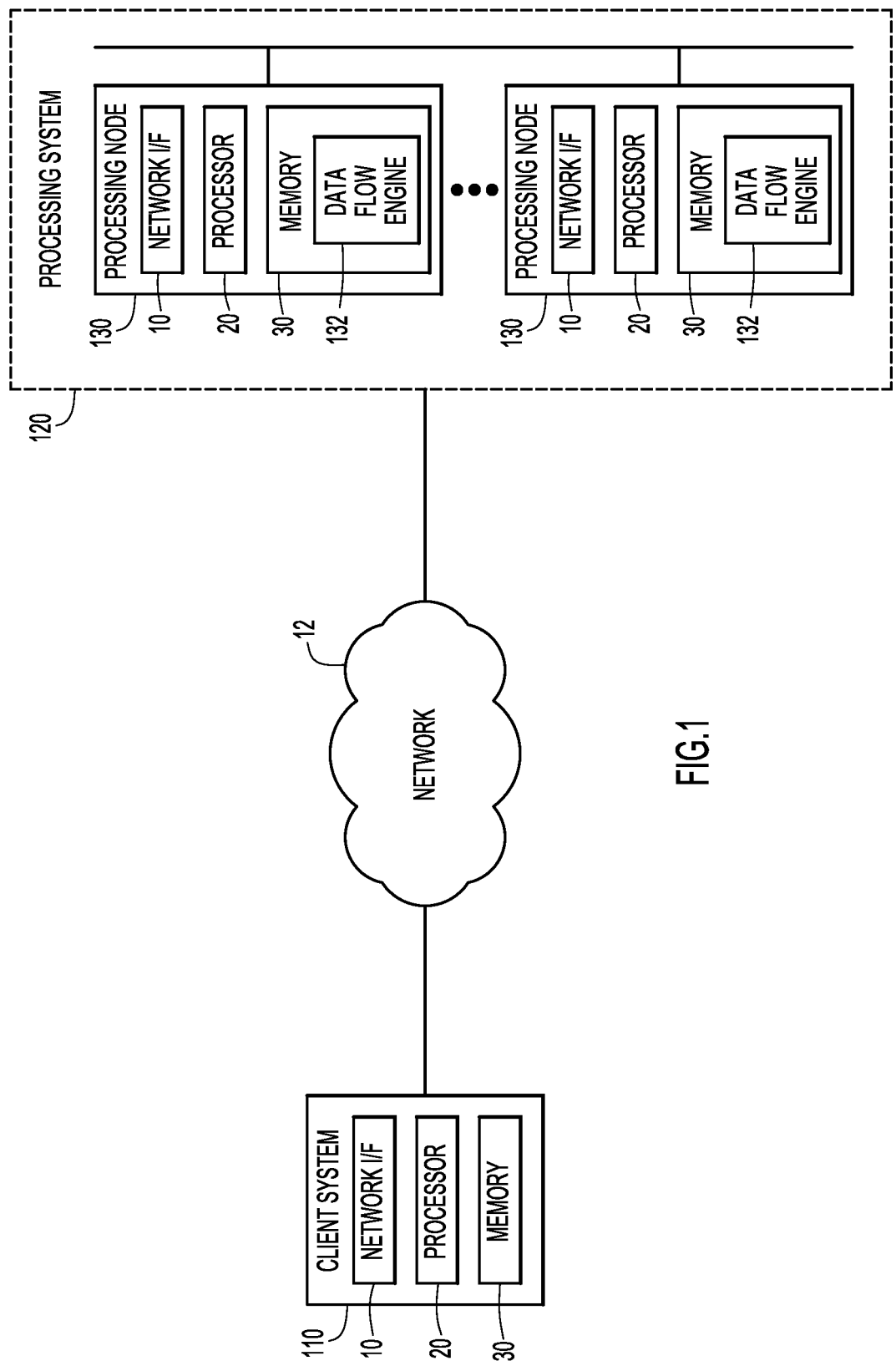
FIG. 1 is a diagrammatic illustration of an example environment for an embodiment of the present invention.

An example environment for use with present invention embodiments is illustrated in FIG. 1. Specifically, the environment includes one or more client systems 110 and one or more processing systems 120. A processing system 120 may comprise one or more processing nodes 130. Alternatively, processing system 120 may be a single computing system. Client system 110, processing system 120, and processing nodes 130 may be remote from each other and communicate over a network 12. The network may be implemented by any number of any suitable communications media (e.g., wide area network (WAN), local area network (LAN), Internet, intranet, etc.). Alternatively, client system 110, processing system 120, and processing nodes 130 may be local to each other, and communicate via any appropriate local communication medium (e.g., local area network (LAN), hardwire, wireless link, intranet, etc.).

Client systems 110 enable users to submit data flow designs to processing system 120 for execution on processing nodes 130. Processing nodes 130 include a data flow engine 132 to generate an execution plan from a data flow design and carry out the execution plan. Processing nodes 130 may access various local or remote data storage devices or other data sources and targets. The client systems may present a graphical user (e.g., GUI, etc.) or other interface (e.g., command line prompts, menu screens, etc.) to receive data flow designs or other information from users and interact with processing system 120.

Client systems 110, processing systems 120, and processing nodes 130 may be implemented by any conventional or other computer systems preferably equipped with a display or monitor, a base (e.g., including at least one processor 20, one or more memories 30 and/or internal or external network interfaces or communications devices 10 (e.g., modem, network cards, etc.)), optional input devices (e.g., a keyboard, mouse or other input device), and any commercially available and custom software (e.g., server/communications software, data flow design software, data flow engine software, etc.).

Data flow engine 132 may include one or more modules or units to perform the various functions of present invention embodiments described below (e.g., generating an execution plan, determining stages at which to compress individual fields or groups of fields, executing the plan, etc.). The various modules or units may be implemented by any combination of any quantity of software and/or hardware modules or units, and may reside within memory 35 of the server and/or client systems for execution by processor 15.

Figure 2:
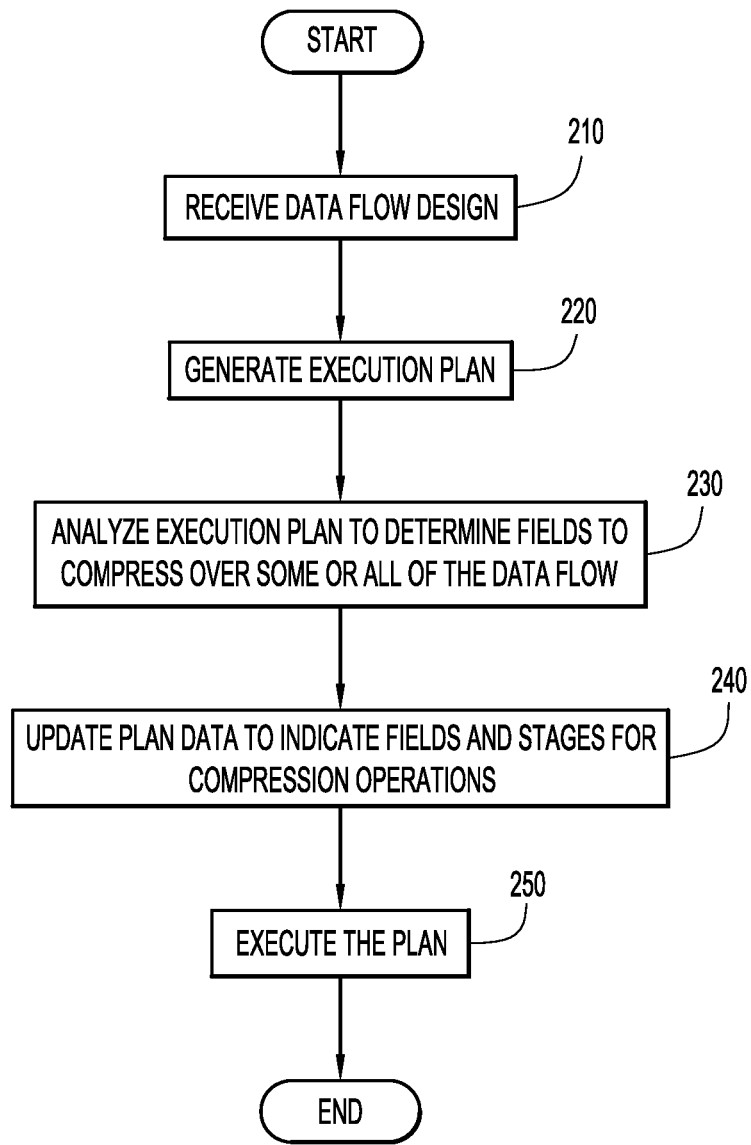
FIG. 2 is a flow diagram illustrating an example manner of processing a data flow design according to an embodiment of the present invention.

An example manner of processing a data flow design (e.g., via a data flow engine 132 and processor 20 of a processing node 130) according to an embodiment of the present invention is illustrated in FIG. 2. Initially, at step 210, processing system 120 receives a data flow design. The data flow design may be formed in any conventional or other manner. For example, a user may design a data flow using a graphical interface on the client system, which sends the data flow design to the processing system (e.g., in the form of a textual and/or binary representation of the design). In a multi-node processing system, a particular processing node 130 (referred to as the conductor node) of the processing system may receive the data flow design.

At step 220, the data flow engine of the conductor node generates an execution plan from the data flow design. The execution plan may be generated in any conventional or other manner. The execution plan specifies a directed acyclic graph of stages connected by datasets. For each stage, the execution plan indicates the processing node the stage will run on, zero or more input datasets, zero or more output datasets, and a set of input and output accessors. The accessors indicate the fields on the input and output datasets that the operator may access during its processing. From the execution plan, the data flow engine knows which fields are accessed by which stages within the flow, which fields are key fields used for sorting and partitioning, when data is being passed over a network, the stages that write data to disk for temporary or longer term data storage, and how many times a field is passed between processing stages.

At step 230, the data flow engine uses this information to analyze the execution plan and determine particular fields or sets of fields to compress over some or all of the data flow. In general, the data flow engine may loop through the stages in the plan looking for new fields that are created by each stage. Typically, new fields will appear on source stages (e.g., a database table read), but can also appear in mid-flow stages (e.g., transformations, aggregations, etc.). When the data flow engine finds a new field, it follows the field through the data flow, summing up weighted values for each transport mechanism and each stage that the field passes through. When it encounters a stage that accesses the field it will compute a score of this run of the field. If the score is better than a threshold value, the field will be marked for compression on the starting stage of the run. The engine will reset the field's sum to zero and continue following the field through the data flow in this manner until the field is dropped or a final target stage (e.g., a write to a target database) is reached. At step 240, the execution engine updates the execution plan data to indicate which fields are to be compressed at which stages based on the results of the analysis. Example manners of processing the execution plan to determine field level compression are further described below.

The execution engine executes the updated plan at step 250, applying the indicated compression operations.

Figure 3:
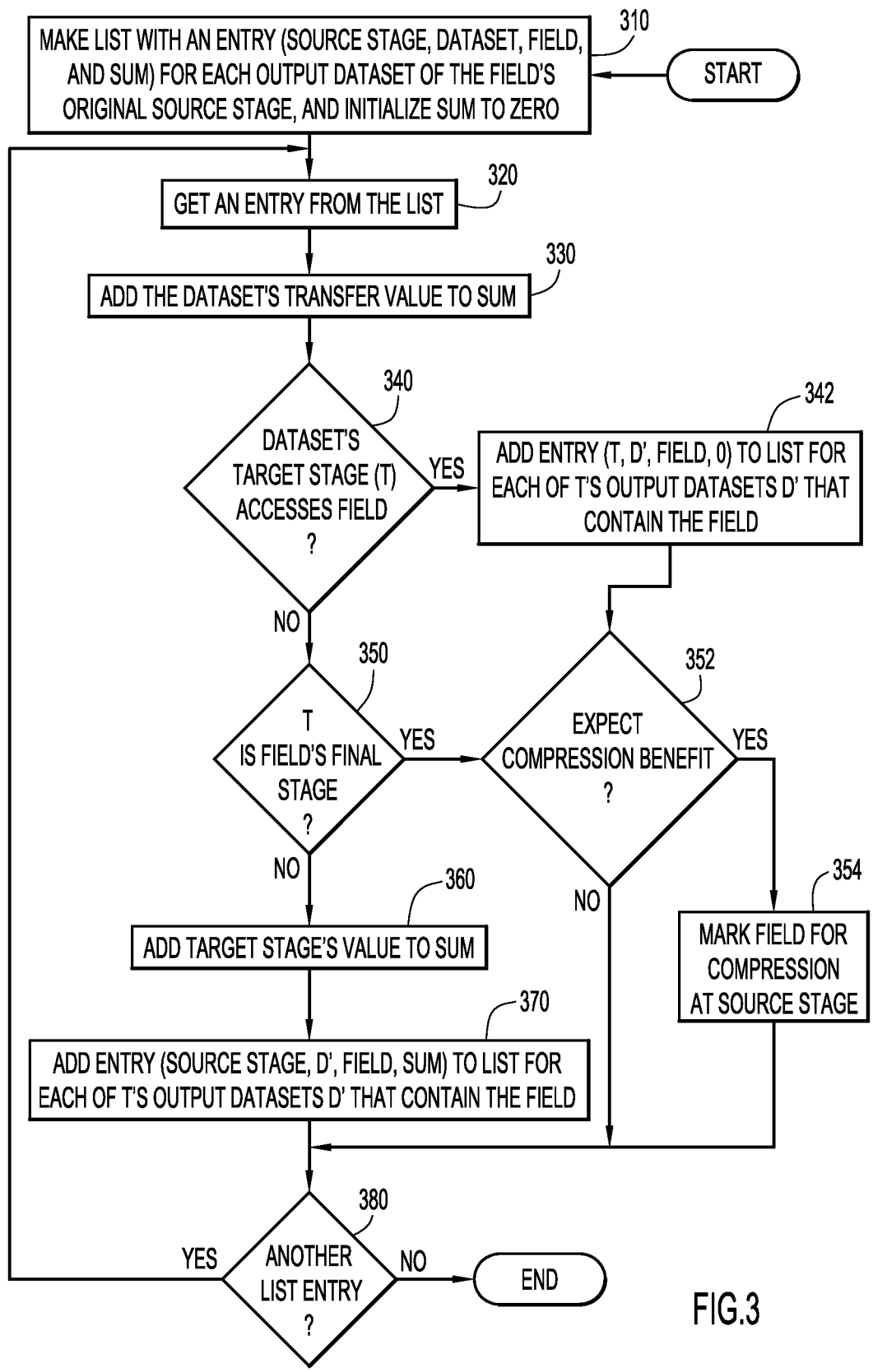
FIG. 3 is a flow diagram illustrating an example manner of analyzing and updating an execution plan to apply field level compression according to an embodiment of the present invention.

An example manner of analyzing and updating an execution plan for field level compression (e.g., via a data flow engine 132 and processor 20 of a processing node 130) according to an embodiment of the present invention is illustrated in FIG. 3. In particular, at step 310, the data flow engine generates an initial list of information about stages at which it may be useful to compress one or more fields. For each field in each output dataset of each stage in the data flow, the data flow engine determines whether the stage receives that field from a previous stage. If not, that stage is the source stage for the field, and the data flow engine adds to the list an entry indicating that stage, output dataset, and field. In addition, each entry in the list contains a sum (initialized to zero) of values related to the usefulness of compressing the field. An entry in the list may be expressed in the form (S, D, F, sum), where S, D, and F indicate a stage, dataset, and field in the execution plan, respectively; and sum is a value related to the expected effect of compressing the field at the indicated stage. The dataset D may be any dataset that includes the field. Each sum is initialized to zero.

The data flow engine retrieves an entry from the list at step 320, and, at step 330, adds a value to the sum based on the transport mechanism (e.g., memory bus, network, disk I/O, etc.) used for the transfer (or hop) to the next stage. For example, the value added to the sum may be a transport weight times the difference between the uncompressed size of the field and the compressed size of the field. The compressed size of the field may, for example, be a predetermined estimate (e.g., an estimate based on the field's data type, a measured compression for the field, etc.) or a runtime estimate based on a sample of the data. The transport weight represents the overhead (e.g., transfer time) of the various transport mechanisms (e.g., 2 for memory transfer, 10 for network transfer, 100 for disk transfer, etc.).

At step 340, the data flow engine determines whether the dataset's target stage accesses the field. If not, the data flow engine determines at step 350 whether the target stage is the final stage for the field (e.g., if the target stage is a final write stage or otherwise has no output datasets for subsequent stages that contain the field).

If the target stage is not the field's final stage, the field will be passed through the target stage and on to another stage when the plan is executed. Accordingly, at step 360, the data flow engine may add a value to the sum representing the reduction in overhead of passing the field through the target stage compressed rather than uncompressed. For example, the value added to the sum may be a stage weight times the difference between the uncompressed size of the field and the compressed size of the field, where the stage weight may be zero if the stage merely passes the data through and non-zero if the stage lands the data to disk (e.g., in order to sort the data).

At step 370, the data flow engine adds a new entry or entries to the list in order to pursue the field forward through the next hop in another iteration of the analysis steps. In particular, new entries (S, D', field, sum) are added to the list for each output dataset D' of the current target stage, T. Stage S is the same stage indicated by the entry retrieved at step 320.

At step 380, the data flow engine determines whether any entries in the list remain to be processed. If so, processing returns to step 320 for another iteration of the process. Otherwise, processing ends.

If the data flow engine determines that the target stage T is the field's final stage at step 350, the data flow engine will determine at step 352 whether to compress the field at the stage S indicated by the entry retrieved at step 320. For example, the data flow engine may adjust the sum for the overhead of compressing and decompressing the field, and compare the adjusted sum to a predetermined threshold (e.g., zero). The sum may be adjusted by, e.g., subtracting a term equal to the field size multiplied by a configurable weight for compression and decompression (e.g., 1, 5, 10, etc.). If the adjusted sum exceeds the threshold, it may be useful to compress the field at stage S, and the data flow engine may mark the field for compression in stage S in the execution plan data at step 354. Processing then proceeds to step 380.

If the data flow engine determines at step 340 that the target stage T accesses the field, the target stage may be considered the source stage for new runs or sequences of hops for the field with a sum initialized to zero. In particular, at step 342, new entries (T, D', field, 0) may be added to the list for each output dataset D' of the current target stage, T. Processing then proceeds to step 352, where the data flow engine determines whether to compress the field for the current run, ending at target stage T.

Alternatively, the principal functionality of FIG. 3 may be implemented using recursive function calls rather than a list. An example manner of recursively analyzing and updating an execution plan fix field level compression (e.g., via a data flow engine 132 and processor 20 of a processing node 130) according to an embodiment of the present invention is described by pseudo-code in FIGS. 4A-4C. Basically, a routine compute_compression_runs is used to recursively descend through the data flow following a particular field through the output datasets of the data flow stages. When a field run ends, the routine computes the score of the run. If the score exceeds a threshold, the routine marks the field for compression at the source stage. The compute_compression_runs routine has arguments source_stage, output_dataset, field, and sum. The source_stage argument points to information of the execution plan about the stage at which a run a field begins. The output_dataset argument points to information of the execution plan about an output dataset that the compute_compression_runs routine will follow to the next stage of the run. The field argument points to information of the execution plan about the field being considered for compression at the source_stage. The sum argument is a running sum of a weight value times the size of the field minus a weight value times an estimate of the compressed size of the field.

Initially, compute_compression_runs is called by a routine mark_field_compression (FIG. 4A), which receives the execution plan and performs nested loops through the stages in the execution plan, the output datasets of those stages, and the fields of those output datasets to identify the first instances of fields appearing in the data flow. The mark_field_compression routine identifies an instance of a field as a first instance if the field is not copied from an input dataset to the stage that produces an output dataset containing the field. If the field is a first instance, the mark_field_compression routine calls compute_compression_runs, passing the stage, dataset, field, and zero as the source_stage, output_dataset, field, and sum arguments, respectively.

The compute_compression_runs routine (FIG. 4B) adds to the sum a transport weight times the difference between the uncompressed size of the field and an estimate of the compressed size of the field at block 410.

At block 420, the compute_compression_runs routine determines the downstream target stage connected to the output_dataset. This stage is denoted current_stage.

At block 430, compute_compression_runs determines whether current_stage accesses the field. If so, the routine calls a function should_compress to determine whether the field should be compressed; if the result is true, the source_stage marks the field for compression. in addition, if current_stage accesses the field, the field run ends at this stage, and the routine prepares for following a new field run by setting the sum to zero and setting the source_stage parameter to current_stage.

At block 440, compute_compression_runs adds to the sum a stage weight times the difference between the uncompressed size of the field and an estimate of the compressed size of the field, where the stage weight may zero if the stage merely passes the data through and non-zero if the stage lands the data to disk (e.g., in order to sort the data).

At block 450, compute_compression_runs loops through the datasets output by Current_stage. For each of those output datasets (denoted cur_output_dataset) that contains the field, compute_compression_runs recursively calls itself with arguments source_stage, cur_output_dataset, field, and sum. In addition, if any cur_output_dataset contains the field, a flag (denoted fieldContinues) is set to indicate that the field continues downstream.

At block 460, compute_compression_runs determines whether the fieldContinues flag is set. If not, the field does not continue (e.g., the field may be dropped or current_stage may be a final stage of the data flow). As a result, the routine calls the function should_compress to determine whether the field should be compressed; if the result is true, the field is marked for compression in the source_stage.

The function should_compress (FIG. 4C) receives a sum and a field parameter, and computes a score equal to the sum minus the field size times a weight for compressing and decompressing the field. The function returns true if the score exceeds a predetermined threshold. Otherwise, the function returns false.

Figure 5:
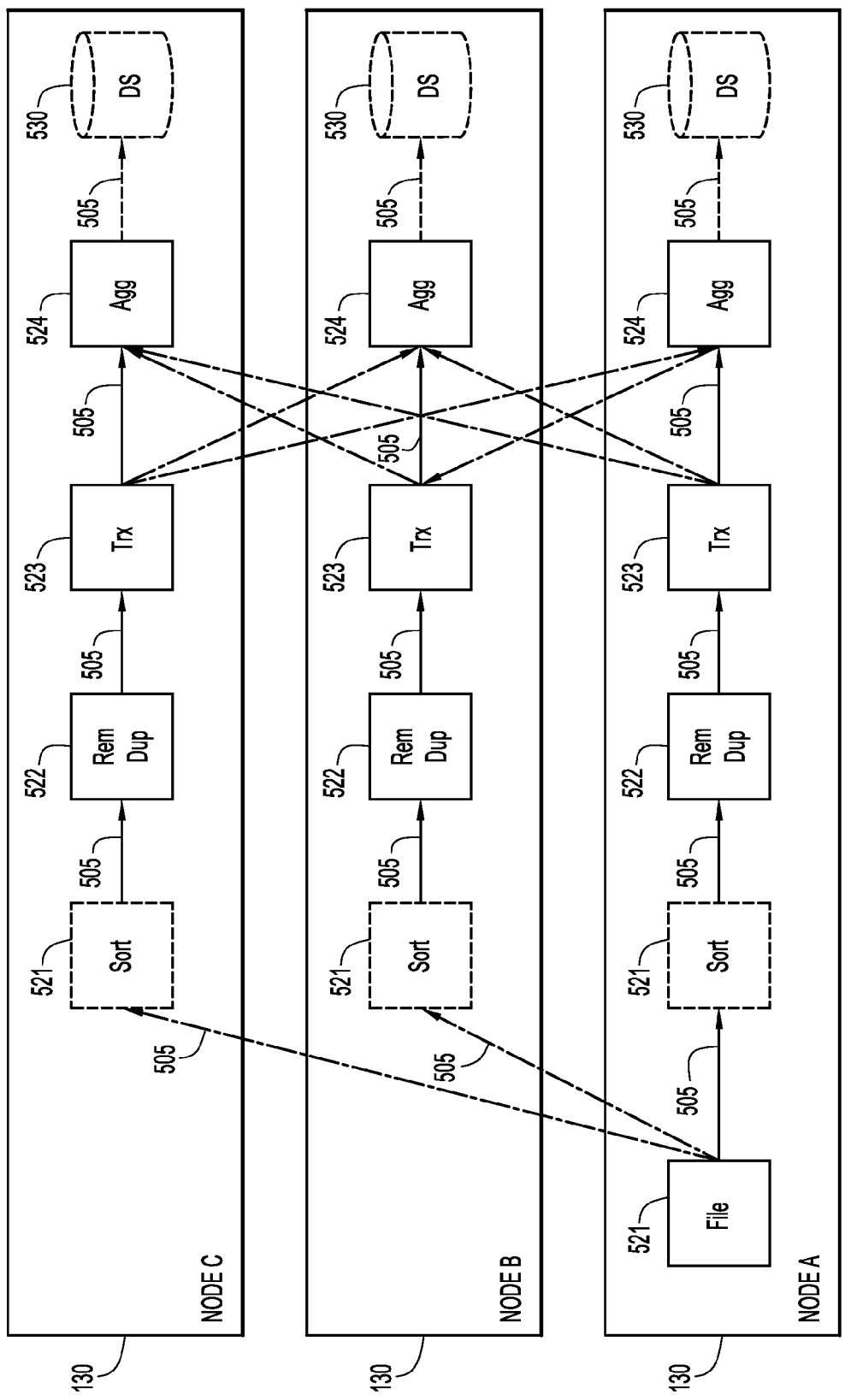
FIG. 5 is a block diagram illustrating an example data flow according to an embodiment of the present invention.

An example data flow of an execution plan according to an embodiment of the present invention is illustrated in FIG. 5. Processing nodes 130 (denoted A, B, and C) each perform a sequence of stages 521-524 (e.g., a sort stage 521, a stage 522 to remove duplicate records, a transformation stage 523, and an aggregation stage 524) on records from an input file 510 and write the final results to local data storage 530. Processing node A reads file 510, divides the contents of the file into records, and distributes the records among the nodes for processing. Records hop to and from stages 521-524 via a transport mechanism 505 (e.g., memory transfer (solid), network transfer (dash-dot), or disk I/O (dotted)). In particular, node A sends records to stage 521 of nodes B and C via the network, and sends records to its own stage 521 via local memory (e.g., inter-process communication). Stage 521 lands the data to disk. Stages 521-523 send output datasets to the succeeding stage on the same node via memory transfer. In addition, stage 523 sends output datasets to stage 524 on each of the other processing nodes via the network. Stage 524 writes to local data storage (e.g., disk).

Each hop that a field takes through a data flow may have a different cost depending on the transport mechanism. Some stages that the field passes through may also incur a cost as well; for example, sort stage 521 may land data to disk. In computing sums and scores, each hop and/or stage may be weighted to approximate the overhead of the data passing through the medium. Example default transfer weights may be as follows: memory transfer weight=2, network transfer weight=10, and disk weight=100. Example default stage weights may be 100 for stages that land data to disk, and zero for stages that do not.

Figure 6:
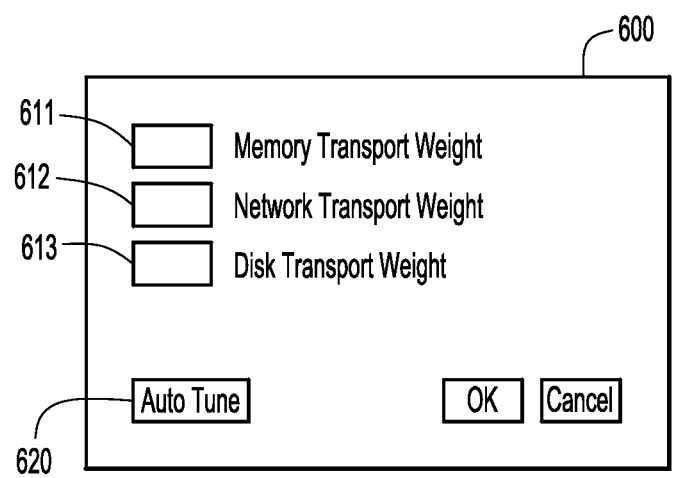
FIG. 6 depicts an interface for setting transfer weights according to an embodiment of the present invention.

The transfer weights, stage weights, and expected compression factors used to compute sums and scores for a field run may be modified by a user or determined using a calibration process. An example, interface for setting the transfer weights according to an embodiment of the present invention is illustrated in FIG. 6. In particular, a dialog box 600 includes text boxes 611-613 for displaying and editing the memory, network, and disk transfer weights, respectively. In addition, a user may elect via button 620 to automatically tune the transfer weights using a calibration process.

The calibration process may calculate transfer weights by running one or more jobs with a fixed size of data (e.g., 10 MB) to measure the amount of time it takes to send the data over the various transport mechanisms for a parallel data flow. For example, the calibration process may measure the time it takes to run a job that merely generates 10 MB of data but doesn't send the data anywhere, the time it takes to generate the same data and send it over shared memory, the time it takes to send the data over the network, the time it takes to write and read the data from disk, etc. In addition, the calibration process may measure times for operations that land data (e.g., sorts) in a similar manner. These measurements may then be used to calculate and set the initial weight values for the transfer and stage weights.

To calculate expected compression ratios for various field types (e.g., integer, short integer, floating point, string, timestamp, etc.), the calibration process may compress a representative set of values for each field type supported by the data flow engine. The results of these tests may be used to calculate each field's expected compression ratio for use in calculating sum and score terms.

In one embodiment of the present invention, the data flow engine may look for fields having runs starting and ending at the same stages and determine whether to compress those fields together. Some field types may not be useful to try to compress individually. For example some integer type fields may not compress enough to make compression worthwhile. The same may be true for small string fields. These fields may be candidates for being combined into a larger single compressed buffer. This allows field types that generally would not be able to be compressed to be combined with enough other fields to make compression worthwhile. The data flow engine may recalculate a compression score for the combined fields to determine if compressing the fields together will result in a performance benefit.

The data flow engine may monitor compression performance at run time. Certain types of data (e.g., image, audio, video data, etc.) may not compress well, and may not be handled specifically by the calibration process. To avoid trying to compress these types of data the data flow engine may monitor the compression ratio that is being achieved for each field that is marked for compression. For each value of a field that is compressed, the engine may determine the compression ratio of that field by dividing the original data size by the compressed data size. This ratio may be added to a running total for the field. After a configurable number of fields processed (e.g., 1000) the average compression ratio will be checked. If this average compression ratio falls below a configurable threshold (e.g., 20%) then compression for the field will be turned off for the remainder of the run. This will avoid wasted processing cycles trying to compress data that does not compress well.

Figure 7:
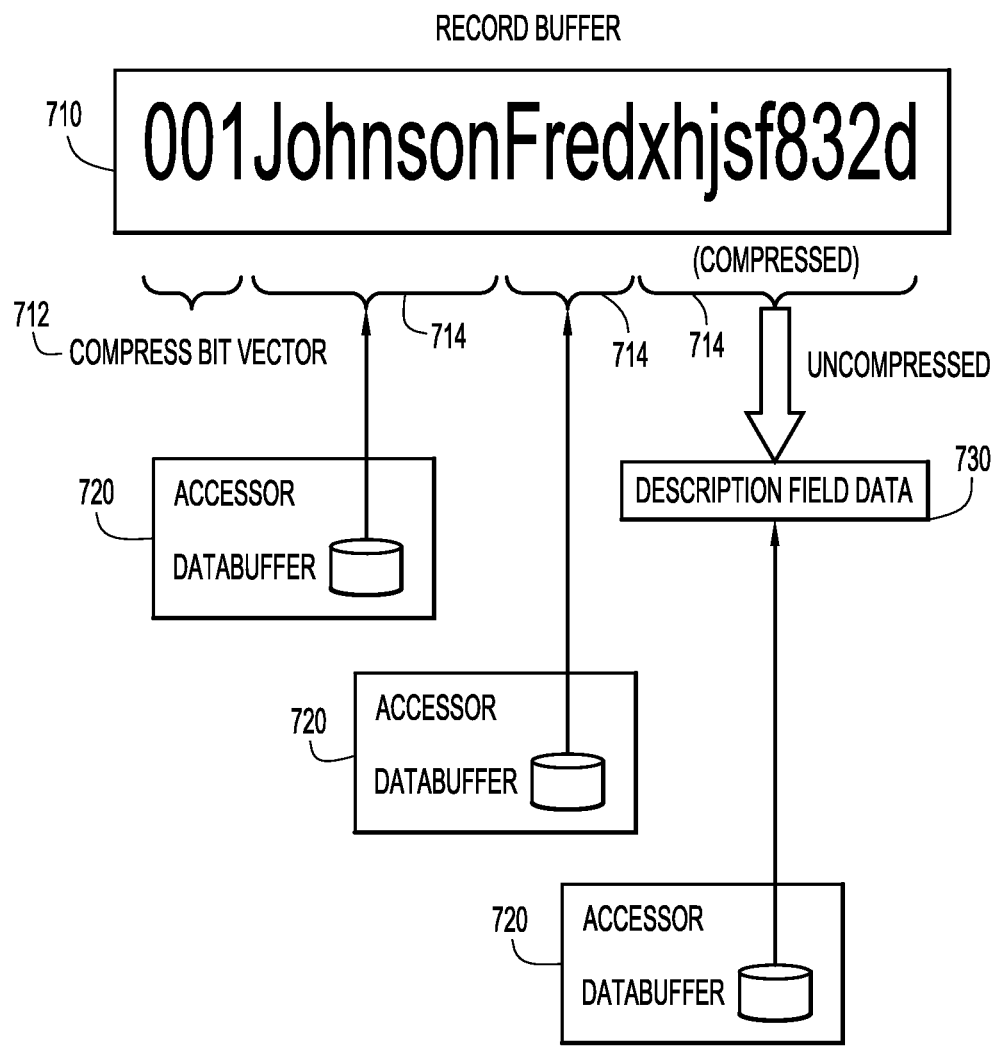
FIG. 7 is block diagram of an access layer for accessing compressed fields in a record within a parallel data flow according to an embodiment of the present invention.

An example manner of accessing compressed fields in a record within a parallel data flow (e.g., at an intermediate stage of the data flow) according to an embodiment of the present invention is illustrated in FIG. 7. By way of example, a record schema may comprise string type fields for last name, first name (e.g., Fred), and a description. A record buffer 710 includes a bit vector 712 in addition to the data for each field 714. A set bit in the bit vector indicates that the corresponding field is compressed. The data flow engine may use the bit vector and an abstraction layer comprising accessors 720 to access corresponding fields. An accessor for an uncompressed field may point directly into the record buffer. When a compressed field is accessed, the compressed data will be uncompressed into a temporary buffer 730. The accessor for that field points to the temporary buffer.

It will be appreciated that the embodiments described above and illustrated in the drawings represent only a few of the many ways of implementing embodiments for selectively compressing data fields in a parallel data flow.

The environment of the present invention embodiments may include any number of computer or other processing systems (e.g., client or end-user systems, server systems, etc.) and storage systems (e.g., file systems, databases, or other repositories), arranged in any desired fashion, where the present invention embodiments may be applied to any desired type of computing environment (e.g., cloud computing, client-server, network computing, mainframe, stand-alone systems, etc.). The computer or other processing systems employed by the present invention embodiments may be implemented by any number of any personal or other type of computer or processing system (e.g., desktop, laptop, PDA, mobile devices, etc.), and may include any commercially available operating system and any combination of commercially available and custom software (e.g., database software, communications software, etc.). These systems may include any types of monitors and input devices (e.g., keyboard, mouse, voice recognition, touch screen, etc.) to enter and/or view information.

It is to be understood that the software of the present invention embodiments may be implemented in any desired computer language and could be developed by one of ordinary skill in the computer arts based on the functional descriptions contained in the specification and flow charts illustrated in the drawings. Further, any references herein of software performing various functions generally refer to computer systems or processors performing those functions under software control. The computer systems of the present invention embodiments may alternatively be implemented by any type of hardware and/or other processing circuitry.

The various functions of the computer or other processing systems may be distributed in any manner among any number of software and/or hardware modules or units, processing or computer systems and/or circuitry, where the computer or processing systems may be disposed locally or remotely of each other and communicate via any suitable communications medium (e.g., LAN, WAN, intranet, Internet, hardwire, modem connection, wireless, etc.). For example, the functions of the present invention embodiments may be distributed in any manner among the various end-user/client and server systems, and/or any other intermediary processing devices, The software and/or algorithms described above and illustrated in the flow charts may be modified in any manner that accomplishes the functions described herein. in addition, the functions in the flow charts or description may be performed in any order that accomplishes a desired operation.

The software of the present invention embodiments may be available on a non-transitory computer useable medium (e.g., magnetic or optical mediums, magneto-optic mediums, floppy diskettes, CD-ROM, DVD, memory devices, etc.) of a stationary or portable program product apparatus or device for use with stand-alone systems or systems connected by a network or other communications medium.

The communication network may be implemented by any number of any type of communications network (e.g., LAN, WAN, Internet, intranet, VPN, etc.). The computer or other processing systems of the present invention embodiments may include any conventional or other communications devices to communicate over the network via any conventional or other protocols. The computer or other processing systems may utilize any type of connection (e.g., wired, wireless, etc.) for access to the network. Local communication media may be implemented by any suitable communication media (e.g., local area network (LAN), hardwire, wireless link, intranet, etc.).

The system may employ any number of any conventional or other databases, data stores or storage structures (e.g., files, databases, data structures, data or other repositories, etc.) to store information. The database system may be implemented by any number of any conventional or other databases, data stores or storage structures (e.g., files, databases, data structures, data or other repositories, etc.) to store information. The database system may be included within or coupled to the server and/or client systems. The database systems and/or storage structures may be remote from or local to the computer or other processing systems, and may store any desired data.

The present invention embodiments may employ any number of any type of user interface (e.g., Graphical User Interface (GUI), command-line, prompt, etc.) for obtaining or providing information, where the interface may include any information arranged in any fashion. The interface may include any number of any types of input or actuation mechanisms (e.g., buttons, icons, fields, boxes, links, etc.) disposed at any locations to enter/display information and initiate desired actions via any suitable input devices (e.g., mouse, keyboard, etc.). The interface screens may include any suitable actuators (e.g., links, tabs, etc.) to navigate between the screens in any fashion.

The present invention embodiments are not limited to the specific tasks or algorithms described above, but may be utilized for selectively compressing fields in any type of data flow (e.g., ETL, database query plan, search engine indexing, etc.) comprising any types of sources, targets, and stages. A determination whether to compress a field may be based on any score or scores for performance improvements or other metrics (e.g., processing time, monetary expense, etc.). For example, a score may be based on summing weighted values for each transport mechanism and each stage of each branch that a field passes through downstream of a source stage or output dataset.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises", "comprising", "includes", "including", "has", "have", "having", "with" and the like, when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention, in this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A computer-implemented method of selectively compressing data fields in a parallel data flow comprising:
   identifying within an execution plan for the parallel data flow a first instance of a data field within a stage of the parallel data flow;
   tracing the identified data field through stages of the parallel data flow and determining a weighted compression score value for the identified data field based on operations performed on the identified data field during traversal of the stages; and
   compressing the identified data field based on the weighted compression score value indicating a performance gain with respect to the compressed data field.

2. The computer-implemented method of claim 1, wherein compressing the identified data field further comprises:
   compressing the identified data field based on a comparison of the weighted compression score value to a predetermined threshold.

3. The computer-implemented method of claim 1, wherein determining a weighted compression score value further comprises:
   assigning weights to the operations performed on the identified data field, wherein the weighted compression score value is determined based on sums of the weighted operations for the identified data field in compressed and uncompressed states.

4. The computer-implemented method of claim 3, further comprising:
   tuning the assigned weights to adapt data field compression for a plurality of data types to a system implementing the parallel data flow.

5. The computer-implemented method of claim 1, wherein tracing the identified data field further comprises:
   tracing the identified data field from a first stage where the identified data field is accessed to each downstream data stage at which the identified data field is subsequently accessed.

6. The computer-implemented method of claim 5, further comprising:
   selectively combining the identified data field in an uncompressed state with another uncompressed data field within the parallel data flow having common ones of the first and second stages in order to compress the combined data fields.

7. The computer-implemented method of claim 1, further comprising:
   providing access to uncompressed data of the compressed data field during traversal of the stages.

* * * * *